United States Patent
Hatakeyama et al.

(10) Patent No.: US 9,515,001 B2
(45) Date of Patent: Dec. 6, 2016

(54) SEMICONDUCTOR DEVICE HAVING POTENTIAL MONITORING TERMINAL TO MONITOR POTENTIAL OF POWER-SUPPLY LINE

(71) Applicant: PS4 Luxco S.a.r.l., Luxembourg (LU)

(72) Inventors: Atsushi Hatakeyama, Tokyo (JP); Toru Ishikawa, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 318 days.

(21) Appl. No.: 13/722,977

(22) Filed: Dec. 20, 2012

(65) Prior Publication Data
US 2013/0162282 A1   Jun. 27, 2013

(30) Foreign Application Priority Data
Dec. 21, 2011   (JP) ................. 2011-279216

(51) Int. Cl.
| | |
|---|---|
| H01L 21/66 | (2006.01) |
| G01R 31/26 | (2014.01) |
| G01R 31/28 | (2006.01) |
| G11C 29/02 | (2006.01) |
| G11C 29/12 | (2006.01) |
| G11C 29/48 | (2006.01) |
| H01L 25/065 | (2006.01) |
| H01L 25/18 | (2006.01) |
| G11C 11/40 | (2006.01) |

(52) U.S. Cl.
CPC .......... *H01L 22/30* (2013.01); *G01R 31/2607* (2013.01); *G01R 31/2884* (2013.01); *G11C 29/021* (2013.01); *G11C 29/1201* (2013.01); *G11C 29/48* (2013.01); *H01L 25/0657* (2013.01); *H01L 25/18* (2013.01); *G11C 11/40* (2013.01); *H01L 2224/16* (2013.01); *H01L 2225/06513* (2013.01); *H01L 2225/06517* (2013.01); *H01L 2225/06541* (2013.01); *H01L 2225/06596* (2013.01); *H01L 2924/13091* (2013.01)

(58) Field of Classification Search
None
See application file for complete search history.

(56) References Cited

U.S. PATENT DOCUMENTS

| | | | | |
|---|---|---|---|---|
| 5,770,964 A | * | 6/1998 | Suma ................. | G01R 31/3185 327/327 |
| 7,187,069 B2 | * | 3/2007 | Uematsu et al. ............. | 257/685 |
| 2002/0024330 A1 | * | 2/2002 | Hosogane ................. | G06F 1/22 323/317 |

FOREIGN PATENT DOCUMENTS

| | | |
|---|---|---|
| JP | 7-225258 | 8/1995 |
| JP | 2004191212 | 7/2004 |

* cited by examiner

*Primary Examiner* — Paresh Patel
(74) *Attorney, Agent, or Firm* — Kunzler Law Group, PC

(57) ABSTRACT

Disclosed herein is a device that includes an internal circuit, a first terminal supplied with a first voltage, a first power-supply line coupled between the first terminal and the internal circuit, a potential monitoring terminal, and a first switch coupled between the internal power-supply line and the potential monitoring terminal.

7 Claims, 10 Drawing Sheets

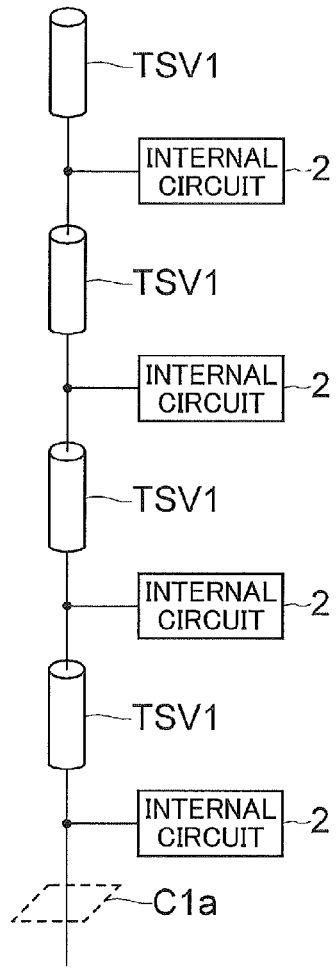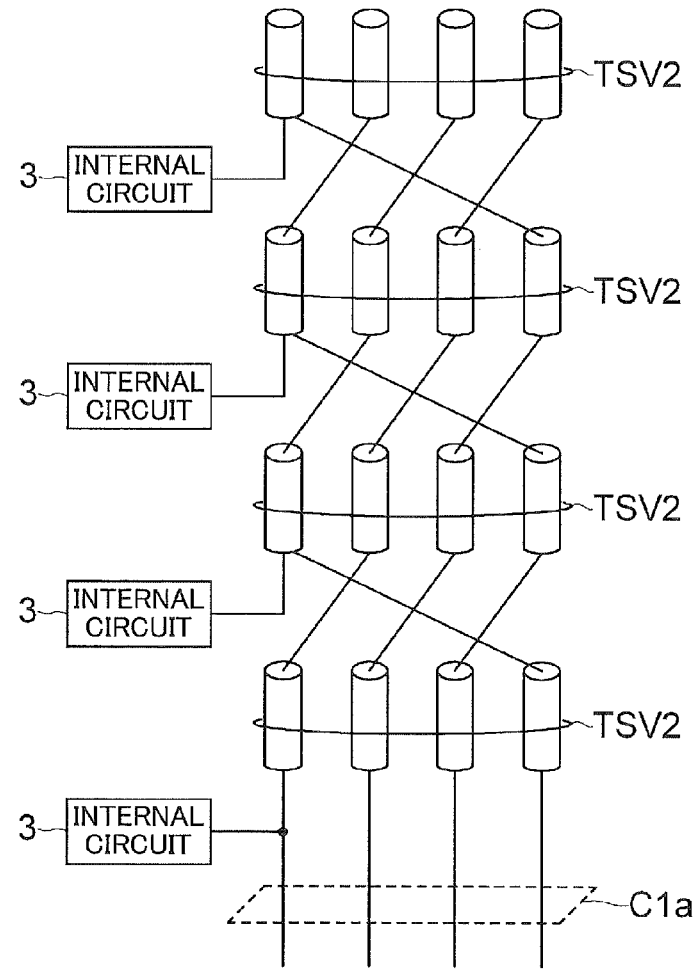
FIG.2A                    FIG.2B

SEMICONDUCTOR DEVICE HAVING POTENTIAL MONITORING TERMINAL TO MONITOR POTENTIAL OF POWER-SUPPLY LINE

BACKGROUND OF THE INVENTION

Field of the Invention

The present invention relates to a semiconductor device and a testing method therefor, and more particularly relates to a semiconductor device configured to detect disconnection or an increase of resistance of an internal power-supply line and a testing method for the semiconductor device.

Description of Related Art

A semiconductor device such as a DRAM (Dynamic Random Access Memory) includes various terminals including a power-supply terminal for receiving a power-supply potential from outside as well as a signal terminal for receiving an input signal from or supplying an output signal to outside. The power-supply terminal is connected to an external power-supply line provided outside of the semiconductor device to receive a power-supply potential from an external power supply device therethrough. The power-supply terminal is also connected to an internal power-supply line provided inside of the semiconductor device to convey the power-supply potential to each circuit part inside the semiconductor device therethrough.

Japanese Patent Application Laid-Open No. H7-225258 discloses a semiconductor device in which a bonding pad as a signal terminal and a lead terminal on a lead frame are connected to each other with a bonding tape or a bonding wire.

The internal power-supply line described above has a risk of the occurrence of disconnection or an increase of resistance. Since some troubles might occur on an operation of the semiconductor device due to such disconnection or an increase of resistance, it is preferable to detect them before shipment.

However, conventionally, there has been no effective method for realizing such detection in a direct manner. Instead, they have been detected in an indirect manner by determining whether the power-supply is normally supplied or not based on a result of an operation check of the semiconductor device. Although the disclosure of Japanese Patent Application Laid-Open No. H7-225258 discloses a method of determining whether bonding is properly performed or not, the method can only confirm whether the bonding is properly performed or not, and it cannot detect disconnection or an increase of resistance of the internal power-supply line.

The points described above are common problems in internal power-supply lines to which a certain type of voltage, such as a reference voltage, is supplied, not only in the internal power-supply line. Therefore, there has been desired a technique that can detect disconnection or an increase of resistance of an internal power-supply line in a direct manner.

SUMMARY

In one embodiment, there is provided a semiconductor device that includes: an internal circuit; a first terminal supplied with a first voltage; a first power-supply line coupled between the first terminal and the internal circuit; a potential monitoring terminal; and a first switch coupled between the internal power-supply line and the potential monitoring terminal.

In another embodiment, there is provided a semiconductor device that includes: an internal circuit; a first terminal supplied with a first voltage; a second terminal supplied with a second voltage different from the first voltage; a first power-supply line coupled between the first terminal and the internal circuit; a second power-supply line coupled between the second terminal and the internal circuit; and a potential monitoring terminal selectively coupled to one of the first and second internal power-supply lines.

Instill another embodiment, there is provided a testing method for a semiconductor device, the method including: supplying a power-supply voltage to a power-supply terminal so that an internal circuit is supplied with the power-supply voltage via a power-supply line coupled between the power-supply terminal and the internal circuit; activating the internal circuit that operates on the power-supply voltage; and measuring a potential of a monitoring terminal coupled to the power-supply line when the internal circuit is activated.

BRIEF DESCRIPTION OF THE DRAWINGS

FIGS. 2A and 2B show connection states of the through silicon vias TSV provided in each of the semiconductor chips C1 to C4 shown in FIG. 1A;

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

In the following explanations, an overall configuration of the semiconductor device 1 is described first, and then characteristic configurations of the present embodiment are described in detail.

Figure 1A:
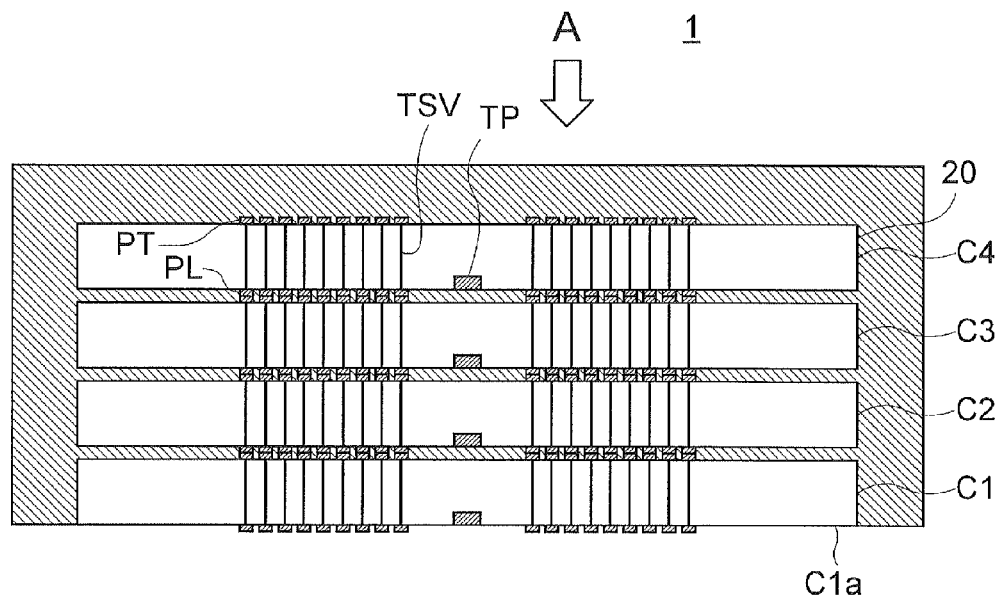
FIG. 1A is a schematic cross-sectional view of a semiconductor device according to a first embodiment of the present invention.

Referring now to FIG. 1A, the semiconductor device 1 according to the first embodiment is a so-called wide IO DRAM having a configuration in which four semiconductor chips C1 to C4 having the same function and the same configuration and manufactured with the same mask are stacked sequentially in this order from the bottom. Each of the semiconductor chips C1 to C4 functions as a so-called DRAM, including a memory cell array and peripheral circuits of the memory cell array (not shown in FIG. 1). The peripheral circuits include a data input/output circuit that performs input and output of data between the memory cell array and outside, a control circuit that controls the input and output operations of the data in response to a command issued from outside. Hereafter, the memory cell array and the peripheral circuits may be collectively referred to as "internal circuit" in some cases. The semiconductor chips C1 to C4 are sealed with a resin in a state of being stacked, and function as a memory device that is integrally packaged.

Figure 1B:
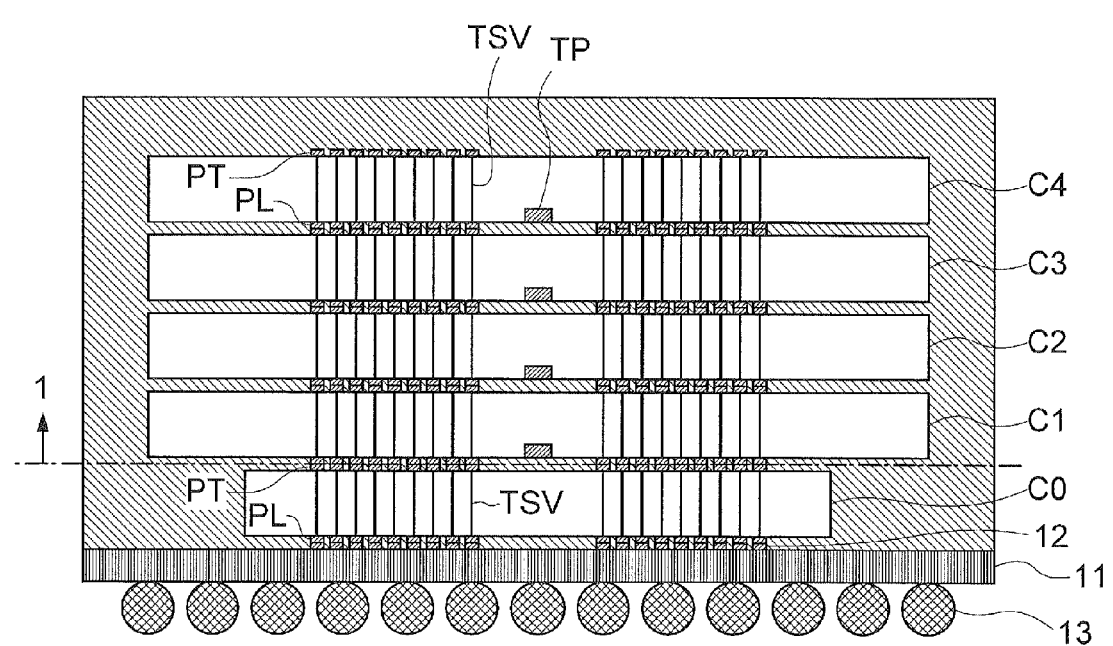
FIG. 1B is a schematic cross-sectional view to explain a structure of a composite semiconductor device into which the semiconductor device shown in FIG. 1 is integrated.

The semiconductor device 1 is a semifinished product, which is provided to an end user as a composite semiconductor device 10 in which the semiconductor device 1 is stacked on a package substrate 11 (an interposer) with a controller chip C0 as shown in FIG. 1B. The controller chip C0 is a semiconductor chip in which a logic circuit is formed on a top surface or a bottom surface of a semiconductor substrate, and is also referred to as "SOC (System On Chip)". The logic circuit in the controller chip C0 controls operations of the semiconductor chips C1 to C4 that are DRAMs. The controller chip C0 and the semiconductor device 1 are integrally sealed with a resin as shown in FIG. 1B. Therefore, a bottom surface C1a of the semiconductor chip C1 is out of the end user's sight. A configuration of the composite semiconductor device 10 is described in detail later.

As shown in FIG. 1A, each of the semiconductor chips C1 to C4 includes a semiconductor substrate (for example, a silicon substrate) 20, and the internal circuit mentioned above is formed on the bottom surface of the semiconductor substrate 20. An input/output terminal PT and an input/output terminal PL are formed on the top surface and the bottom surface, respectively, of each of the semiconductor chips C1 to C4. The terminal PL and the internal circuit are connected to each other with a wiring line provided on the bottom surface. The terminal PL and the terminal PT are connected to each other with a through silicon via or a penetration electrode TSV that penetrates through the semiconductor substrate 20. Further, the terminal PT of each of the semiconductor chips C1 to C3 is contacted with the terminal PL of a semiconductor chip on a layer right above. With this configuration, the input/output terminals of each of the semiconductor chips C1 to C4 are drawn to the bottom surface C1a of the semiconductor chip C1 on the lowermost layer.

The connection states of the through silicon vias TSV include two types shown in FIG. 2A and FIG. 2B. Note that the terminals PT and PL are omitted from FIGS. 2A and 2B. In the following explanations, the through silicon vias TSV corresponding to FIG. 2A and FIG. 2B are referred to as "through silicon via TSV1" and "through silicon via TSV2", respectively.

The through silicon via TSV1 shown in FIG. 2A is short-circuited with the through silicon via TSV1 on another layer provided at the same position in a planar view in the stacking direction, that is, when viewed in a direction of an arrow A shown in FIG. 1A. That is, as shown in FIG. 2A, the through silicon vias TSV1 provided at the same position in the planar view are short-circuited with each other, and a single current path is formed by these through silicon vias TSV1. This current path is connected to an internal circuit 2 of each of the semiconductor chips C1 to C4. Therefore, an input signal (a command signal, an address signal, a clock signal, and the like) supplied to the current path from outside via the bottom surface C1a of the semiconductor chip C1 is commonly input to the internal circuits 2 of the semiconductor chips C1 to C4. Furthermore, an output signal (data and the like) supplied to the current path from the internal circuit 2 of each of the semiconductor chips C1 to C4 undergoes a wired-OR operation, and is output to outside from the bottom surface C1a of the semiconductor chip C1.

Figure 3:
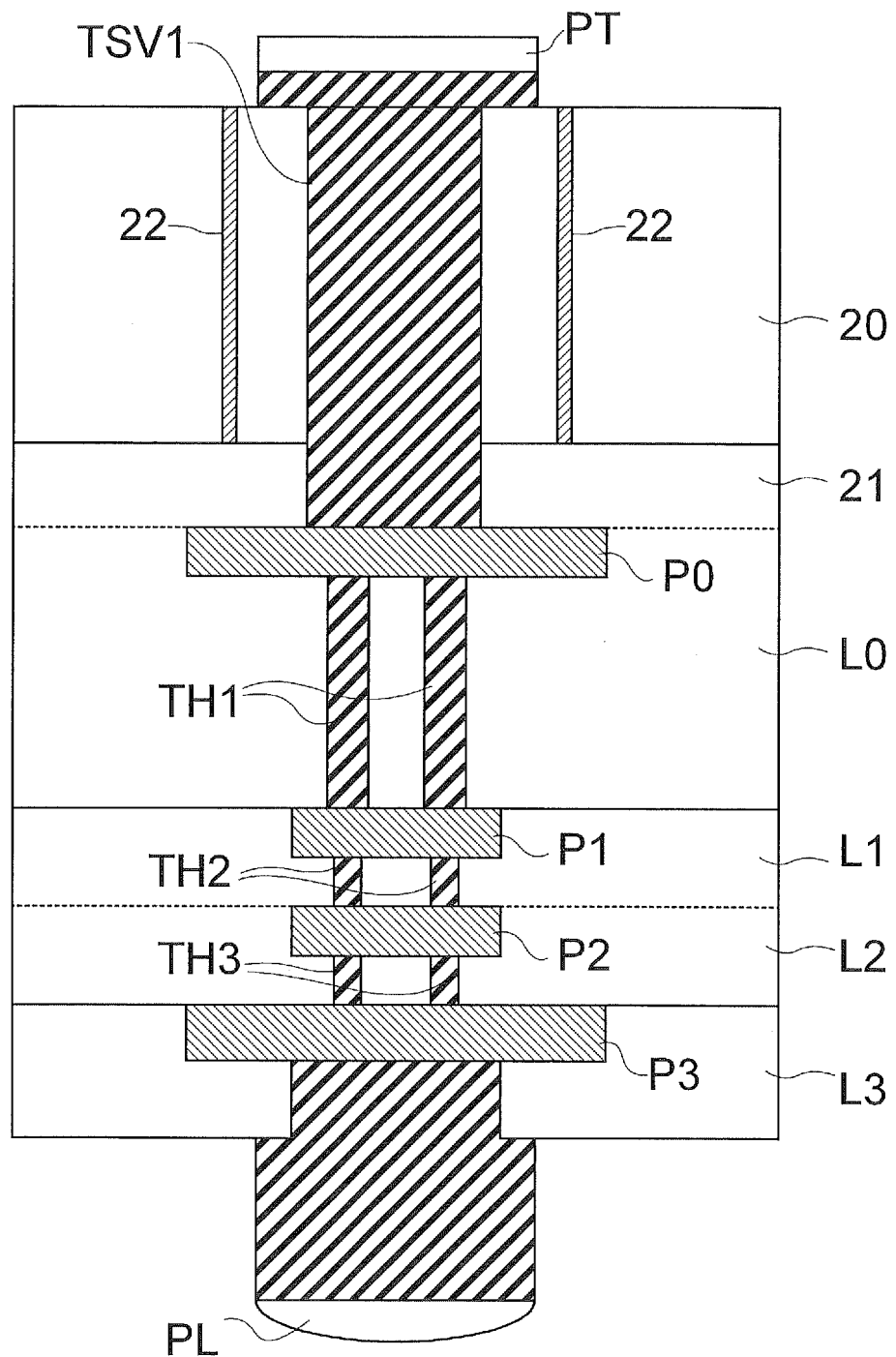
FIG. 3 is a cross-sectional view of the through silicon via TSV1 shown in FIG. 2A.

As shown in FIG. 3, the through silicon via TSV1 is formed so as to penetrate the semiconductor substrate 20 and an inter-layer insulation film 21 on a surface of the semiconductor substrate 20. An insulation ring 22 is provided around the through silicon via TSV1, by which insulation is secured between the through silicon via TSV1 and a transistor area (an area where a transistor constituting the internal circuit is formed). The insulation ring 22 can be doubly provided, with which a capacitance between the through silicon via TSV1 and the semiconductor substrate 20 can be reduced.

The lower end of the through silicon via TSV1 is connected to the terminal PL (a front surface bump) provided on the bottom surface of the semiconductor chip via pads P0 to P3 provided on each of wiring layers L0 to L3 and a plurality of through-hole electrodes TH1 to TH3 connecting between the pads. On the other hand, the upper end of the through silicon via TSV1 is connected to the terminal PT (a back surface bump) of the semiconductor chip. The terminal PT is connected to the terminal PL of the semiconductor chip on the upper layer. With this configuration, two through silicon vias TSV1 provided at the same position in the planar view are short-circuited with each other. Connection with the internal circuit 2 shown in FIG. 2A is made via an internal wiring line (not shown) drawn from the pads P0 to P3 respectively provided on the wiring layers L0 to L3.

On the other hand, the structure indicated by the through silicon via TSV2 shown in FIG. 2B is called "spiral connection". Specifically, in each of the semiconductor chips C1 to C4, four (that is, the number of layers) through silicon vias TSV2 are provided at the same positions in the planar view. An internal circuit 3 of each of the semiconductor chips C1 to C4 is connected to a through silicon via TSV2 provided at a predetermined position from among the four through silicon vias TSV2 (in FIG. 2B, the through silicon via TSV2 at the leftmost side). The through silicon via TSV2 to which the internal circuit 3 is connected is connected with the through silicon vias TSV2 on another layers provided at a different position in the planar view for each layer, by which a current path penetrating the semiconductor chips C1 to C4 is formed. With this configuration, the current path is formed for each internal circuit 3, and a lower end of each current path is exposed to the bottom surface C1a. Therefore, via the current paths, it becomes possible to input information from outside selectively to the internal circuit 3 of each layer. A specific example of such information includes a chip select signal and a clock enable signal, which are described later.

Figure 4:
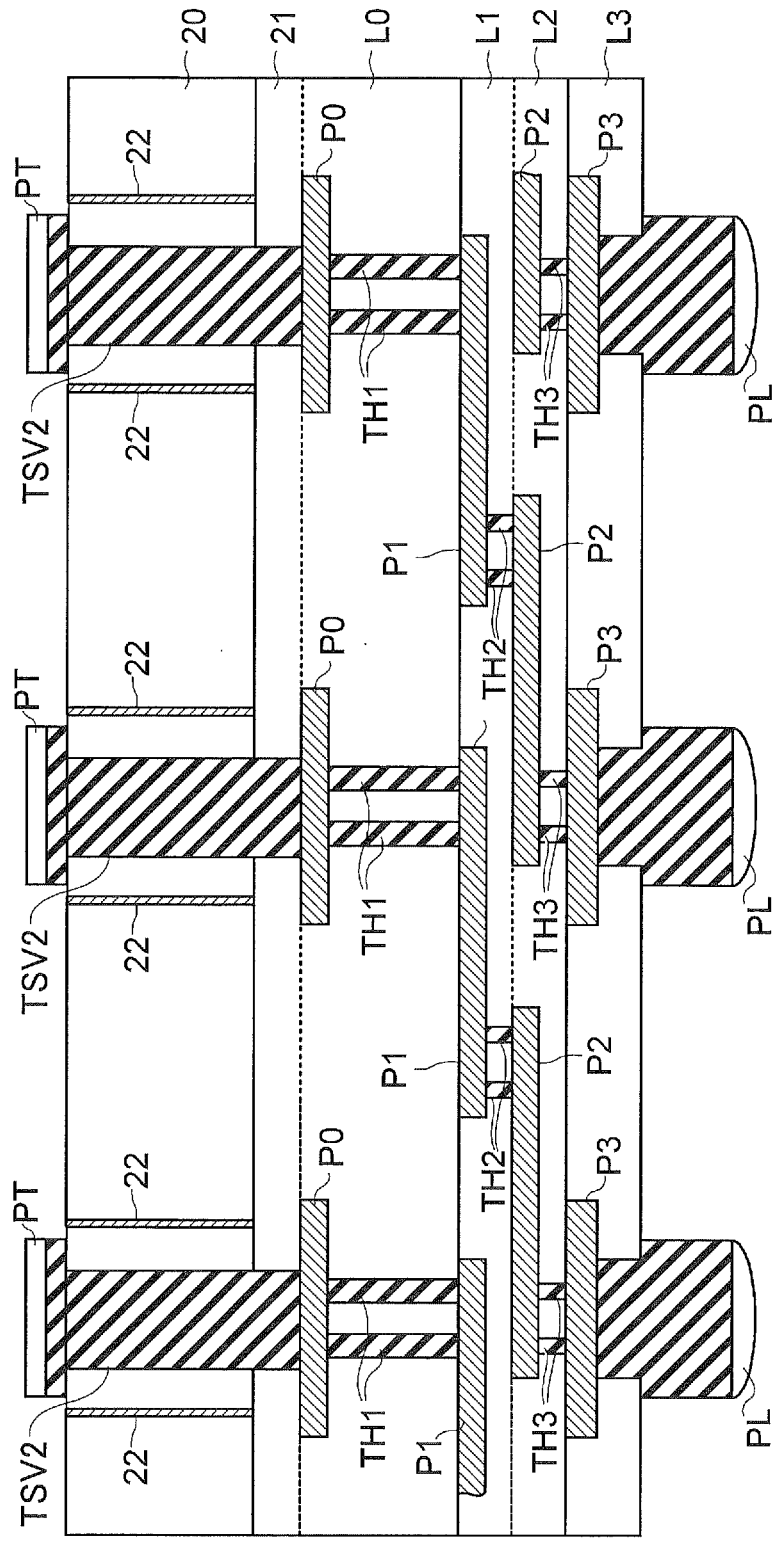
FIG. 4 is a cross-sectional view of the through silicon vias TSV2 shown in FIG. 2B.

As shown in FIG. 4, the through silicon via TSV2 is different from the through silicon via TSV1 in that the pads P1 and P2 located at the same planar position are not connected to each other with the through-hole electrode TH2, but the pads P1 and P2 located at different positions are connected to each other with the through-hole electrode TH2. Although only three through silicon vias TSV2 are shown in FIG. 4, the actual number of through silicon vias TSV2 is the number of semiconductor chips (four) per signal in each of the semiconductor chips C1 to C4.

Referring back to FIG. 1A, a test pad TP is further provided on the bottom surface of the semiconductor substrate of each of the semiconductor chips C1 to C4. The test pad TP is a pad for contacting a test probe when testing the semiconductor chip on the wafer level, which is connected to anyone of the terminals PL provided on the same bottom surface with a wiring line in the plane. Although the test of the semiconductor device described in the first embodiment is not a test on the wafer level but a test after assembling, the test is performed by using the test pad TP provided on the bottom surface C1a. Details on this matter are described later.

Figure 5:
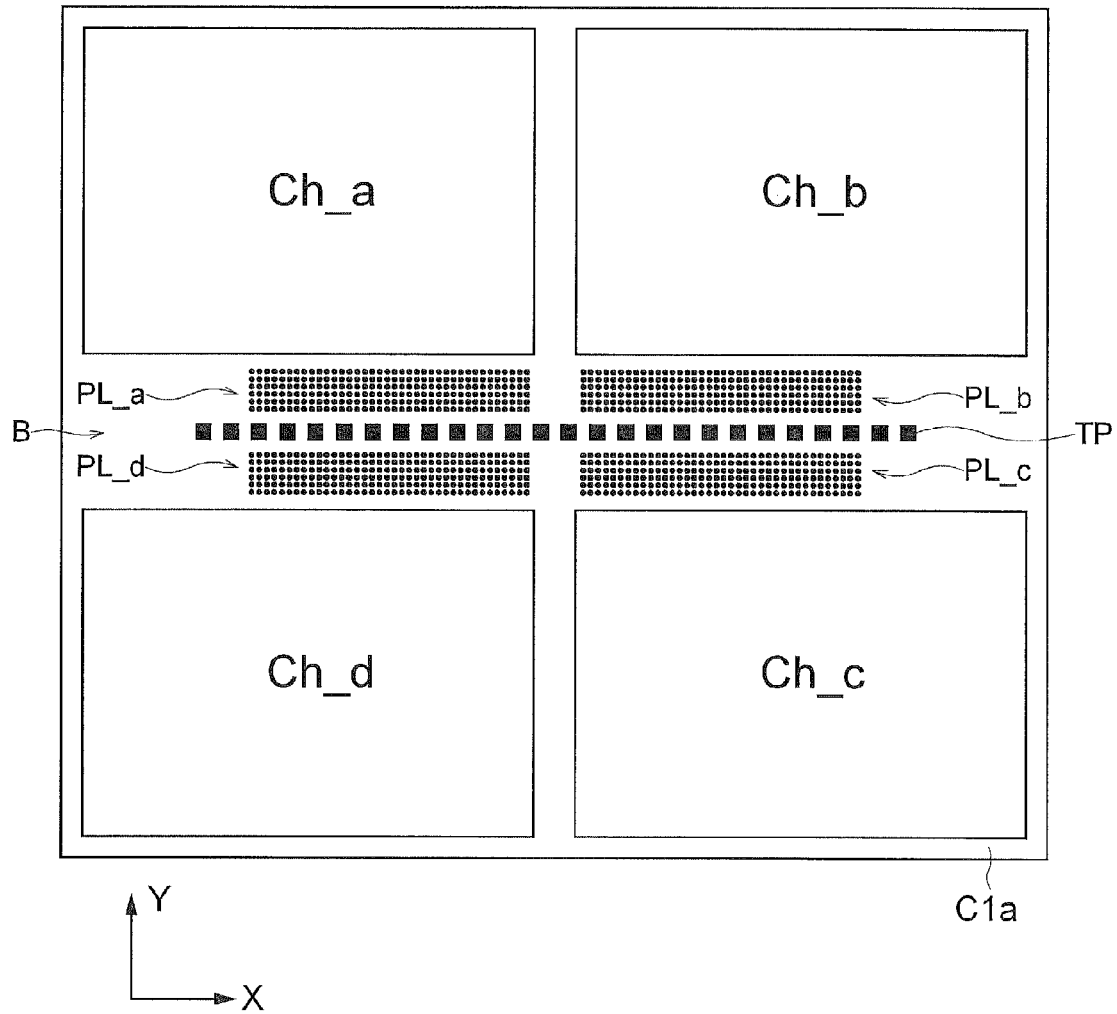
FIG. 5 is a plan view of the bottom surface C1a of the semiconductor chip C1 shown in FIG. 1A.

As shown in FIG. 5, four channels Ch_a to Ch_d, a plurality of terminals PL_a to PL_d corresponding respectively to the channels Ch_a to Ch_d, and a plurality of test pads TP are provided on the bottom surface C1a of the semiconductor chip C1. The channels Ch_a to Ch_d are semiconductor circuits configured to transmit and receive various signals including a command signal, an address signal, a data signal, and the like with outside independently of each other, and each of them functions as a single DRAM. That is, the semiconductor chip C1 is configured to perform various operations as a DRAM, such as a read operation, a write operation, a refresh operation, and the like, for each channel independently. Although not shown in FIG. 5, the bottom surfaces of other semiconductor chips C2 to C4 have the same configuration as the bottom surface C1a of the chip C1.

As shown in FIG. 5, the channels Ch_a and Ch_b are arranged on one side in a Y direction, and the channel Ch_c and the channel Ch_d are arranged on the other side in the Y direction. A terminal area B is provided between the channels Ch_a and Ch_b and the channels Ch_c and Ch_d, and the terminals PL_a to PL_d and the test pads TP are arranged in the terminal area B. Specifically, the terminals PL_a to PL_d are respectively arranged in a plurality of arrays near the corresponding channels in the terminal area B, and the test pads TP are arranged in a row in an area between the terminals PL_a and PL_b and the terminals PL_c and PL_d. As shown in FIG. 5, dimensions and intervals of the test pads TP are set to be larger than those of the terminals PL. This arrangement facilitates that the test probe makes contact with the test pads TP. Performing the test of the semiconductor device 1 by using the test pad TP having the above configuration makes it possible to perform the test without causing any damage on the terminals PL and the through silicon vias TSV of the semiconductor chip.

The configuration of the composite semiconductor device 10 is described in detail below with reference to FIG. 1B. The same terminals PT and PL as those of the semiconductor chips C1 to C4 are provided on the top surface and the bottom surface of the controller chip C0, respectively. The terminal PT of the chip C0 is connected to the terminal PL of the semiconductor chip C1. On the other hand, the terminal PL of the chip C0 is connected to a bump electrode 12 (described later) provided on the top surface of the package substrate 11. As shown in FIG. 1B, the through silicon via TSV is also provided on the semiconductor substrate of the controller chip C0, and the terminals PT and PL and the internal circuit of the controller chip C0 are connected to each other with the through silicon via TSV.

Figure 6A:
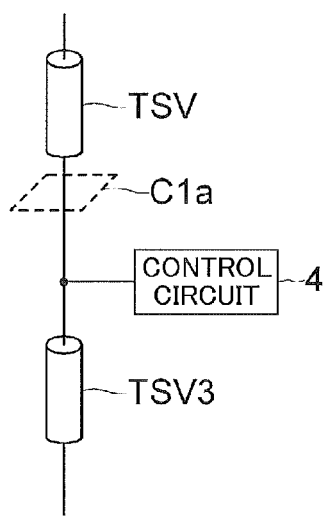
FIGS. 6A to 6C show connection states of the through silicon via TSV provided on the controller chip C0 shown in FIG. 1B.
Figure 6B:
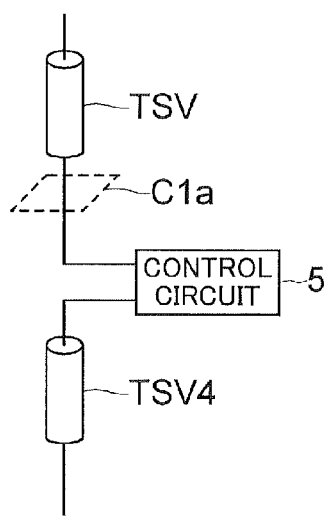
Figure 6C:
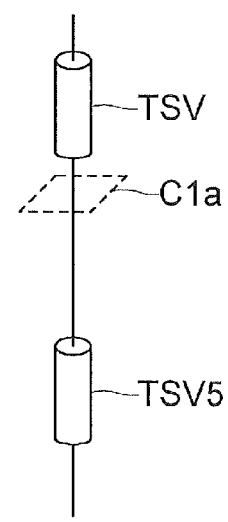

The connection states of the through silicon via TSV provided on the controller chip C0 include three types as respectively shown in FIG. 6A to 6C. Note that the terminals PT and PL are omitted from FIGS. 6A to 6C. In the following explanations, the through silicon vias TSV corresponding to the three types are referred to as "through silicon via TSV3", "through silicon via TSV4", and "through silicon via TSV5", respectively. Through silicon vias TSV other than the through silicon vias TSV3 to TSV5 shown in FIGS. 6A to 6C are the through silicon vias TSV provided on the semiconductor chip C1.

The through silicon via TSV3 shown in FIG. 6A is connected to the through silicon via TSV of the semiconductor chip C1 and also to a control circuit 4 of the controller chip C0. The through silicon via TSV3 having this configuration is used as a power-supply line, for example.

The through silicon via TSV4 shown in FIG. 6B is connected to the through silicon via TSV of the semiconductor chip C1 via a control circuit 5 provided on the controller chip C0. With this configuration, for example, the controller chip C0 is configured to generate an internal command by decoding a command input to the composite semiconductor device 10 via the bump electrode 12 (FIG. 1B) from outside and output the generated internal command to the semiconductor chips C1 to C4.

The through silicon via TSV5 shown in FIG. 6C is connected to the through silicon via TSV of the semiconductor chip C1, but not connected to any circuit in the controller chip C0. Providing the through silicon via TSV5 having this configuration enables input and output of data between the semiconductor chips C1 to C4 and outside in a direct manner.

Referring back to FIG. 1B, the package substrate 11 is provided to convert a terminal pitch of the package substrate 11, in which the bump electrodes 12 that are respectively connected to the terminals PL of the controller chip C0 are provided on the top surface and bump electrodes 13 of the same number as the number of the bump electrodes 12 on the top surface are formed on the bottom surface with an area and an interval larger than those of the bump electrode 12 on the top surface. The bump electrodes 12 on the top surface and the bump electrodes 13 on the bottom surface are connected to each other on a one-to-one basis with a through silicon via (not shown) that penetrates the package substrate 11. The composite semiconductor device 10 is mounted on a motherboard of a computer, a mobile phone, or the like through the bump electrodes 13 in a flip-chip manner.

The overall configuration of the semiconductor device 1 is as described above. In the semiconductor device 1 having the stacking structure described above, a fault of the internal power-supply line is likely to occur, as compared to a semiconductor device that does not have a stacking structure. This is because an increase of resistance of the through silicon via TSV or a contact fault of the terminal PT and the terminal PL are likely to occur. Meanwhile, because the semiconductor chips are stacked in the semiconductor device 1, it is not possible to monitor the resistance of the through silicon via TSV and the contact state of the terminal PT and the terminal PL between the chips in a direct manner from outside. According to the semiconductor device and the testing method of the first embodiment, it is possible to detect disconnection or an increase of resistance of the internal power-supply line in the semiconductor device 1 in a direct manner, instead of detecting it in an indirect manner from a result of an operation check of the semiconductor device. This aspect is described below in detail below.

Figure 7:
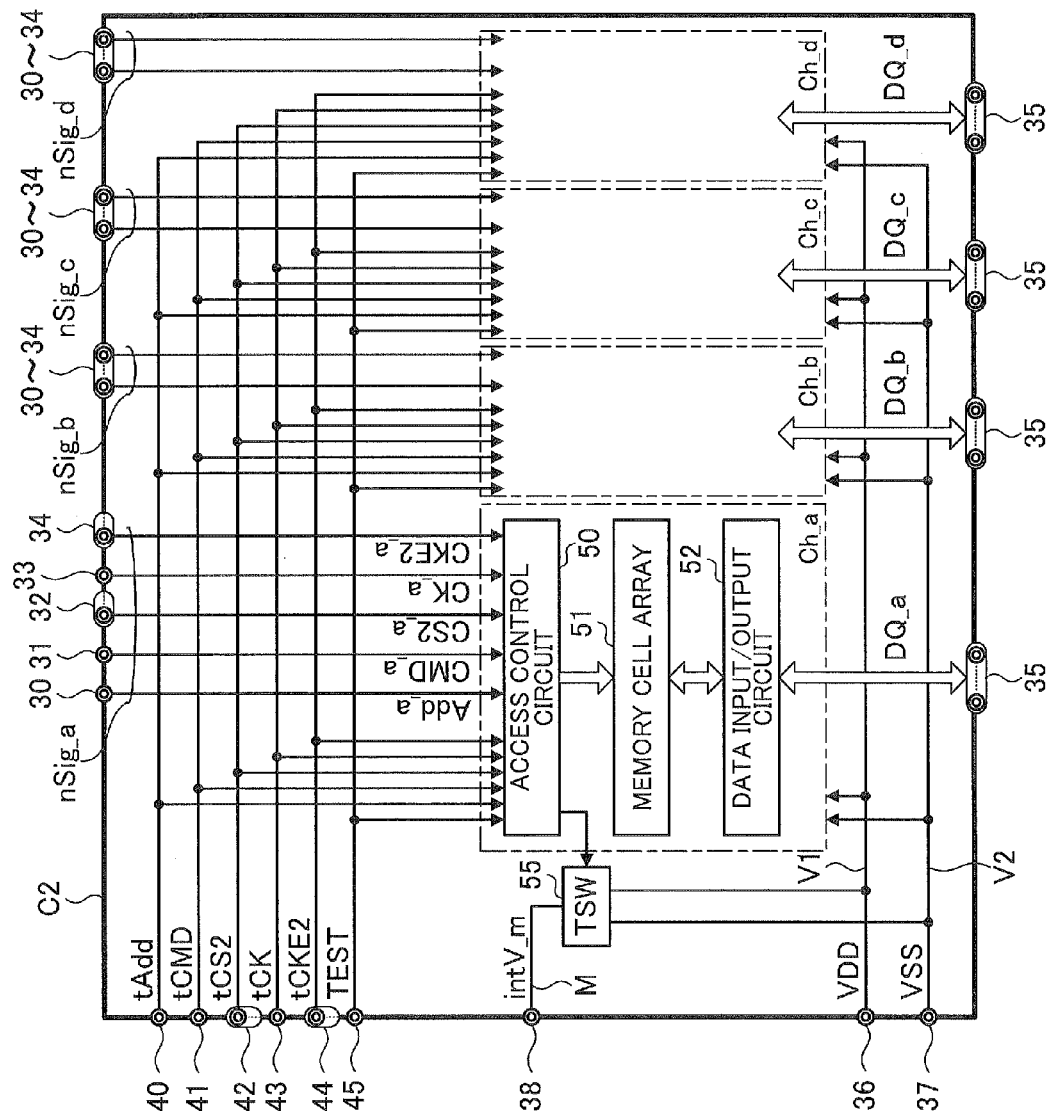
FIG. 7 is a schematic block diagram showing function blocks of the semiconductor chip C2 shown in FIG. 1A.

Turning to FIG. 7, the semiconductor chip C2 includes an address terminal 30, a command terminal 31, a chip select terminal 32, a clock terminal 33, a clock enable terminal 34, and a data input/output terminal 35 for each channel, and includes, commonly for the four channels Ch_a to Ch_d, power-supply terminals 36 and 37, a potential monitoring terminal 38, a test address terminal 40, a test command terminal 41, a test-chip select terminal 42, a test clock terminal 43, a test-clock enable terminal 44, and a test terminal 45. Among these terminals, the chip select terminal 32, the clock enable terminal 34, the test-chip select terminal 42, and the test-clock enable terminal 44 constitute the terminals PL connected to the through silicon via TSV2 described above. Other terminals among the above terminals constitute the terminals PL connected to the through silicon via TSV1 described above. Although not shown in FIG. 7, other semiconductor chips C1, C3, and C4 have the same configuration.

The plurality of terminals PL corresponding to the address terminal 30, the command terminal 31, the chip select terminal 32, the clock terminal 33, and the clock enable terminal 34 are terminals for inputting various control signals (a normal signal group nSig) after incorporating the semiconductor device 1 that is a semifinished product in the composite semiconductor device 10 that is a finished product, which are not connected to the test pads TP shown in FIG. 5. The reference characters of these signals are attached with "a" at the end in FIG. 7, which indicates that the signals are supplied to the channel Ch_a. The same is true for other signals described later. Therefore, before incorporating the semiconductor device 1 in the composite semiconductor device 10, that is, in a state where the bottom surface C1a of the semiconductor chip C1 is exposed (hereinafter, this state is referred to as "before assembling"), it is not possible to access these terminals from outside.

On the other hand, the terminals PL corresponding to the data input/output terminal 35, the power-supply terminals 36 and 37, the potential monitoring terminal 38, the test address terminal 40, the test command terminal 41, the test-chip select terminal 42, the test clock terminal 43, the test-clock enable terminal 44, and the test terminal 45 are connected to the test pads TP shown in FIG. 5. Therefore, it is possible to access these terminals from an external tester at a stage before assembling. In the test of the semiconductor device 1 according to the first embodiment, various test signals are input from the test pads TP by using these terminals, and various signals indicating a test result are extracted. Not all the data input/output terminals 35 need to be connected to the test pads TP, but only a part of the data input/output terminals 35 can be configured to be connected to the test pads TP.

As shown in FIG. 7, the channel Ch_a includes an access control circuit 50, a memory cell array 51, and a data input/output circuit 52. Although not shown in FIG. 7, other channels Ch_b to Ch_d have the same configuration. The access control circuit 50 implements a read/write operation and the like with respect to the memory cell array 51 by accessing the memory cell array 51 in response to a command signal and an address signal input from outside. The memory cell array 51 has a configuration in which memory cells each having a cell capacitor and a cell transistor are arranged at each intersection of a plurality of word lines and a plurality of bit lines. The memory cell array 51 according to the first embodiment includes a row decoder that activates a word line according to a control of the access control circuit 50, a column decoder that connects a bit line to the data input/output circuit 52 according to a control of the access control circuit 50, and the like. The data input/output circuit 52 has a function of outputting read data read from the memory cell array 51 to outside at the time of a read operation and a function of supplying write data supplied from outside to the memory cell array 51 at the time of a write operation.

The semiconductor chip C2 further includes a test switch circuit (TSW) 55. The switch circuit 55 is provided between internal power-supply lines V1 and V2 (described later) and a monitoring line M (described later), and controls connection between the internal power-supply lines V1 and V2 and the monitoring line M based on a control by the access control circuit 50.

The clock terminal 33 is a terminal to which an external clock signal CK is supplied, and the clock enable terminal 34 is a terminal to which a clock enable signal CKE2 is input. These signals are supplied to the semiconductor chip C2 from the controller chip C0. The number "2" in the reference characters indicates that the signal is not supplied to the semiconductor chips C1, C3, and C4, but to the semiconductor chip C2. The same is true for other signals described later.

On the other hand, the test clock terminal 43 is a terminal to which a test clock signal tCK is supplied, and the test-clock enable terminal 44 is a terminal to which a test-clock enable signal tCKE2 is input. These signals are supplied to the semiconductor chip C2 from the external tester. The external clock signal CK and the test clock signal tCK are the same signals except that a time when these signals are supplied and a supply route are different, and the operations of channels that receive these signals are also the same. The same is true for the clock enable signal CKE2_a and the test-clock enable signal tCKE2.

The external clock signal CK, the clock enable signal CKE2, the test clock signal tCK, and the test-clock enable signal tCKE2 are supplied to the access control circuit 50 of a corresponding channel. The access control circuit 50 is configured to perform various processes in synchronism with the external clock signal CK when the clock enable signal CKE2 is activated and perform various processes in synchronism with the test clock signal tCK when the test-clock enable signal tCKE2 is activated.

The chip select terminal 32 is a terminal to which a chip select signal /CS2 generated by the controller chip C0 is supplied. On the other hand, the test-chip select terminal 42 is a terminal to which a test-chip select signal /tCS2 generated by the external tester is supplied. These signals are also supplied to the access control circuit 50 of a corresponding channel, and the access control circuit 50 is configured to receive an input of a command signal CMD (described later) when the chip select signal /CS2 is activated and receive a test command signal tCMD (described later) when the test-chip select signal /tCS2 is activated.

The command terminal 31 is a terminal to which the command signal CMD generated by the controller chip C0 is supplied. The command signal CMD includes a row-address strobe signal /RAS, a column-address strobe signal /CAS, a write enable signal /WE, an on-die termination signal ODT, and the like. On the other hand, the test command terminal 41 is a terminal to which the test command signal tCMD generated by the external tester is supplied. Specific contents of the test command signal tCMD are the same as those of the command signal CMD.

The command signal CMD and the test command signal tCMD are also supplied to the access control circuit 50 of a corresponding channel. If the command signal CMD is supplied when the chip select signal /CS2 is activated, the access control circuit 50 generates an internal command according to the contents of the command signal CMD. This internal command includes an act command, a write command, a read command, and the like. The access control circuit 50 then controls the memory cell array 51 according to the generated internal command. With this operation, various processes including a read/write operation are performed. The same is true for the test command signal tCMD. That is, if the test command signal tCMD is supplied when the test-chip select signal /tCS2 is activated, the access control circuit 50 performs the generation of the internal command and a control of the memory cell array 51 according to the contents of the test command signal tCMD. With this operation, various processes including a read/write operation are performed.

The address terminal 30 is supplied with an address signal Add generated by the controller chip C0. On the other hand, the test address terminal 40 is supplied with a test address signal tAdd generated by the external tester.

The address signal Add and the test address signal tAdd are also supplied to the access control circuit 50 of a corresponding channel. The address signal Add is supplied in synchronism with the command signal CMD, and the access control circuit 50 performs an operation indicated by the command signal CMD with respect to an address indicated by the address signal Add. As a specific example, when the command signal CMD is an act command, the access control circuit 50 handles the input address signal Add as a row address, and controls the memory cell array 51 to activate a word line corresponding to the row address. Furthermore, when the command signal CMD is a write command, the access control circuit 50 handles the input address Add as a column address, and controls the memory cell array 51 such that a bit line corresponding to the column address is connected to the data input/output circuit 52. The same is true for the test address signal tAdd. That is, the test address signal tAdd is supplied to the access control circuit 50 in synchronism with the test command signal tCMD. The access control circuit 50 performs an operation indicated by the test command signal tCMD that is simultaneously input with respect to an address indicated by the test address signal tAdd.

The data input/output terminal 35 is a terminal for performing input of write data DQ and output of read data DQ. The data input/output terminal 35 is connected to the data input/output circuit 52. The data input/output circuit 52 outputs the read data DQ read from the memory cell array 51 to outside via the data input/output terminal 35 at the time of a read operation, and supplies the write data DQ input via the data input/output terminal 35 to the memory cell array 51 at the time of a write operation.

The power-supply terminals 36 and 37 are supplied with a power-supply voltage VDD (first voltage) and a power-supply voltage VSS (second voltage) (VDD>VSS), respectively. The power-supply terminals 36 and 37 are respectively connected to the internal circuit of the semiconductor chip C2 with the internal power-supply lines V1 and V2 (first and second power-supply lines). The power-supply voltages VDD and VSS respectively supplied to the power-supply terminals 36 and 37 are supplied to each circuit in the semiconductor chip C2 that includes the channels Ch_a to Ch_d. Each circuit in the semiconductor chip C2 runs with the power-supply voltages VDD and VSS supplied in the above manner.

The test terminal 45 is supplied with a test signal TEST. The test signal TEST is commonly supplied to the four channels Ch_a to Ch_d. When the test signal TEST is supplied, the access control circuit 50 of each of the channels Ch_a to Ch_d enters into a test mode, thereby allowing a reception of each signal related to the test of the semiconductor device 1 according to the first embodiment, such as the test clock signal tCK.

The potential monitoring terminal 38 is a terminal for monitoring voltages of the internal power-supply lines V1 and V2 from the external tester, and is connected to both the internal power-supply lines V1 and V2 with the monitoring line M. As described above, the switch circuit 55 is provided between the monitoring line M and the internal power-supply lines V1 and V2.

The control of the switch circuit 55 is performed by the access control circuit 50 of the channel Ch_a. The switch circuit 55 is constituted to include a transistor for each internal power-supply line as described later. The access control circuit 50 of the channel Ch_a controls ON and OFF of the switch circuit 55 based on pieces of ON/OFF control information for the transistor, which are supplied as the test address signal tAdd and the test command signal tCMD. The control information is set in advance such that only one of the total of eight internal power-supply lines V1 and V2 included in the semiconductor chips C1 to C4 is connected to the potential monitoring terminal 38. With this configuration, a potential of the internal power-supply line connected in the above manner is reflected on a potential intV_m of the potential monitoring terminal 38.

In the following explanations, a notation such as "semiconductor substrate 20 (C1)" is sometimes used. It represents the semiconductor substrate 20 (see FIG. 3 and the like) that constitutes the semiconductor chip C1.

Figure 8:
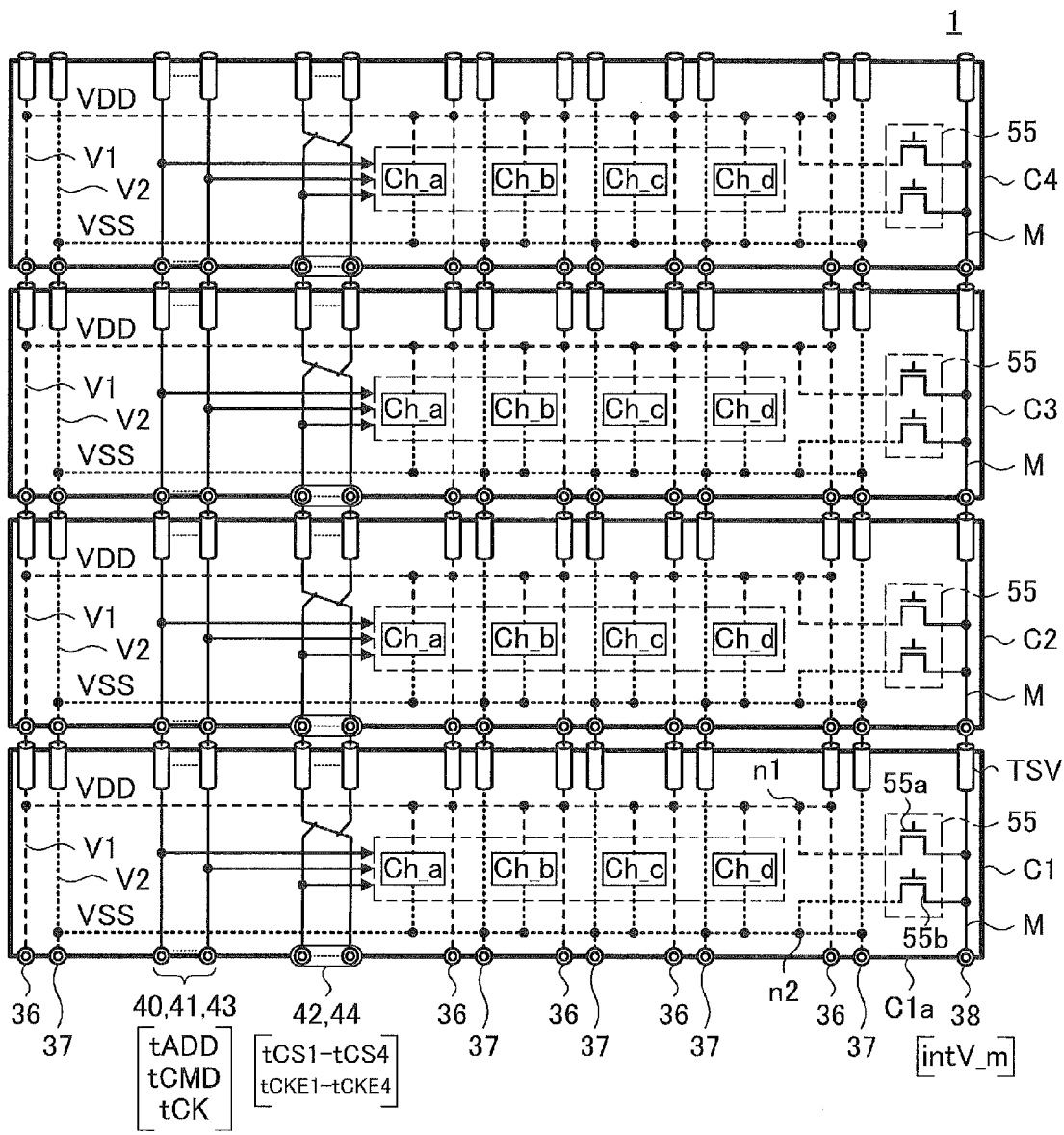
FIG. 8 is a schematic diagram showing a connection state of wiring lines between the semiconductor chips and inside the semiconductor chip shown in FIG. 1A.

Turning to FIG. 8, the internal power-supply line V1 is connected to the power-supply terminal 36 (first terminal) of the semiconductor chip C1 at the bottom surface C1a of the semiconductor chip C1. The internal power-supply line V1 is then connected to the internal circuits (the channels Ch_a to Ch_d) of the semiconductor chip C1 on the bottom surface C1a. Furthermore, the internal power-supply line V1 is introduced to the bottom surfaces of the semiconductor substrates 20 (C2) to 20 (C4) via the through silicon via TSV provided on the semiconductor substrate 20 (C1) (first through silicon via), the through silicon via TSV provided on the semiconductor substrate 20 (C2) (fourth through silicon via), and the through silicon via TSV provided on the semiconductor substrate 20 (C3), and is connected to the internal circuits (the channels Ch_a to Ch_d) of the semiconductor chips C2 to C4 on the bottom surfaces. The through silicon via TSV constituting the internal power-supply line V1 is the through silicon via TSV1 shown in FIG. 2A.

The internal power-supply line V2 has a same configuration as that of the internal power-supply line V1. That is, the internal power-supply line V2 is connected to the power-supply terminal 37 (second terminal) of the semiconductor chip C1 at the bottom surface C1a of the semiconductor chip C1. The internal power-supply line V2 is then connected to the internal circuits (the channels Ch_a to Ch_d) of the semiconductor chip C1 on the bottom surface C1a. Furthermore, the internal power-supply line V2 is introduced to the bottom surfaces of the semiconductor substrates 20 (C2) to 20 (C4) via the through silicon via TSV provided on the semiconductor substrate 20 (C1) (second through silicon via), the through silicon via TSV provided on the semiconductor substrate 20 (C2) (fifth through silicon via), and the through silicon via TSV provided on the semiconductor substrate 20 (C3), and is connected to the internal circuits (the channels Ch_a to Ch_d) of the semiconductor chips C2 to C4 on the bottom surfaces. The through silicon via TSV constituting the internal power-supply line V2 is also the through silicon via TSV1 shown in FIG. 2A.

As shown in FIG. 8, each of the semiconductor chips C1 to C4 has a plurality of power-supply terminals 36 and a plurality of power-supply terminals 37. The internal power-supply line V1 including the through silicon via TSV is provided for each of the power-supply terminals 36, and the internal power-supply lines V1 are connected to each other on the surface of each of the semiconductor substrates 20 (C1) to 20 (C4). The internal power-supply line V2 has the same configuration. That is, the semiconductor device 1 has a plurality of wiring lines of the internal power-supply lines V1 and V2. Such a configuration is employed to stabilize the voltage by providing a plurality of power supply paths.

The monitoring line M is connected to the potential monitoring terminal 38 of the semiconductor chip C1 at the bottom surface C1a of the semiconductor chip C1. The monitoring line M is then connected to the internal power-supply lines V1 and V2 via the switch circuit 55 at nodes n1 and n2 shown in FIG. 8 on the bottom surface C1a. Furthermore, the monitoring line M is introduced to the bottom surfaces of the semiconductor substrates 20 (C2) to 20 (C4) via the through silicon via TSV provided on the semiconductor substrate 20 (C1) (third through silicon via), the through silicon via TSV provided on the semiconductor substrate 20 (C2) (sixth through silicon via), and the through silicon via TSV provided on the semiconductor substrate 20 (C3). The monitoring line M is then connected to the internal power-supply lines V1 and V2 in the plane via the switch circuit 55. The through silicon via TSV constituting the monitoring line M is also the through silicon via TSV1 shown in FIG. 2A.

As shown in FIG. 8, the switch circuit 55 includes a transistor 55a (first switch) and a transistor 55b (second switch) for each semiconductor chip. The transistor 55a is connected between the internal power-supply line V1 and the monitoring line M. On the other hand, the transistor 55b is connected between the internal power-supply line V2 and the monitoring line M. With this configuration, the internal power-supply lines V1 and V2 and the monitoring line M are independently configured in an electrically separable manner. Although each of the first and second switches is represented with a symbol of an N-channel MOS transistor in FIG. 8, in practice, it is more preferable to constitute each of the first and second switches with a so-called transferred gate, in which an N-channel MOS transistor and a P-channel MOS transistor are connected in parallel. Furthermore, transistors of different conduction types can be also used for the first and second switches.

The test address terminal 40, the test command terminal 41, and the test clock terminal 43 provided on the bottom surface C1a are respectively connected to internal signal lines including the through silicon via TSV1 shown in FIG. 2A, thus being commonly connected to the internal circuits (the channels Ch_a to Ch_d). The test-chip select terminal 42 and the test-clock enable terminal 44 are provided on the bottom surface C1a for each semiconductor chip, and are respectively connected to internal signal lines including the through silicon via TSV2 shown in FIG. 2B. The test-chip select terminal 42 and the test-clock enable terminal 44 are then connected to the internal circuits (the channels Ch_a to Ch_d) of the corresponding semiconductor chip via the internal signal lines.

A testing method for the semiconductor device 1 according to the first embodiment is described below with reference to FIG. 8.

In a test of the semiconductor device 1 according to the first embodiment, first, supply of the power-supply voltages VDD and VSS is started from an external tester to the power-supply terminals 36 and 37 of the bottom surface C1a of the semiconductor chip C1. Although a plurality of power-supply terminals 36 and a plurality of power-supply terminals 37 are provided on the bottom surface C1a as described above, the power-supply voltage VDD can be supplied to only one of the power-supply terminals 36 and the power-supply voltage VSS can be supplied to only one of the power-supply terminals 37. It is also possible to supply the power-supply voltage VDD to a plurality of power-supply terminals 36 and supply the power-supply voltage VSS to a plurality of power-supply terminals 37. The voltage supply to the power-supply terminals 36 and 37 from the external tester is performed via the test pads TP shown in FIG. 5. The same is true for signals supplied to other terminals.

Subsequently, supply of the test clock signal tCK is started from the external tester to the test clock terminal 43. Furthermore, supply of test-clock enable signals tCKE1 to tCKE4 is started from the external tester to the test-clock enable terminal 44. With this operation, each of the channels Ch_a to Ch_d of the semiconductor chips C1 to C4 starts an operation. In this case, not all the semiconductor chips C1 to C4 need to be operated, but only a part of the semiconductor chips can be operated. However, it is not preferable to perform the test in a state where none of the semiconductor chips is operated. The reason for this is explained below.

First, the reason why the testing method is capable of determining an increase of resistance of the internal power-supply lines V1 and V2 is explained. In this testing method, as described above, at least an internal circuit of a semiconductor chip runs during the test. When one or more internal circuits run, current is consumed, and the consumed current is replenished through the internal power-supply lines V1 and V2. If at least one of the internal power-supply lines V1 and V2 has increased resistance, the internal power-supply lines V1 and V2 cannot supply a sufficient current to the internal circuits. When the current becomes insufficient, for example, a potential of the internal power-supply line V1 is decreased and a potential of the internal power-supply line V2 is increased, which is then reflected on the potential intV_m of the potential monitoring terminal 38. Therefore, by measuring the potential intV_m, the increase of resistance of the internal power-supply lines V1 and V2 can be determined.

On the other hand, if any of the internal circuits of the semiconductor chip does not run during the test, little current is consumed. As a result, the potentials of the internal power-supply lines V1 and V2 hardly change even if at least one of the internal power-supply lines V1 and V2 has increased resistance. Naturally, the potential intV_m also hardly change. Therefore, it becomes difficult to determine the increase of resistance of the internal power-supply lines V1 and V2 by the measurement of the potential intV_m. This is the reason why it is not preferable to perform the test in a state where none of the semiconductor chips is operated.

After starting operations of the semiconductor chips C1 to C4, various operations such as a read/write operation can be performed by inputting necessary signals from the external tester to a test-chip select signal tCS, the test command signal tCMD, and the test address signal tAdd. The current consumption then becomes larger, enabling the detection of the increase of resistance of the internal power-supply lines V1 and V2 more easily.

Upon starting an operation of the semiconductor chip, a measurement of the potential intV_m is started from the external tester. Before the measurement, any one of four transistors 55a and four transistors 55b provided in the semiconductor chips C1 to C4, is turned on and other transistors are turned off by inputting the test signal TEST from the test terminal 45 in order to perform the measurement. This enables a measurement of the potentials of the internal power-supply lines V1 and V2 at a desired position. In an actual test, it is preferable to measure the potentials of the internal power-supply lines V1 and V2 at all the measurable positions by performing the measurement with switching ON/OFF of the transistors. Because the potentials of the internal power-supply lines V1 and V2 are measured in the above manner, disconnection or an increase of resistance of the internal power-supply lines V1 and V2 can be detected by this testing method.

As described above, according to the semiconductor device 1 of the first embodiment, because the potential monitoring terminal 38 and the monitoring line M that connects the potential monitoring terminal 38 to the internal power-supply lines V1 and V2 inside the semiconductor device 1 are provided, it is possible to detect a voltage decrease of the internal power-supply line V1 or a voltage floating of the internal power-supply line V2 can be detected from the external tester. Therefore, it is possible to detect disconnection of the power-supply lines V1 and V2 that occurs at a position on an inner side of the semiconductor device 1 than the power-supply terminals 36 and 37. In addition, because at least one of the semiconductor chips C1 to C4 runs while performing the test, it is also possible to detect an increase of resistance of the internal power-supply lines V1 and V2 that occurs at a position on an inner side of the semiconductor device 1 than the power-supply terminals 36 and 37.

Furthermore, according to the semiconductor device 1 of the first embodiment, even regarding the semiconductor chips C2 to C4 to which the power is supplied through the through silicon via TSV (semiconductor chips of which the test pads TP are hidden), the potentials of the internal power-supply lines V1 and V2 can be monitored inside each of the chips. Therefore, even disconnection or an increase of resistance of the internal power-supply lines V1 and V2, which is caused by a contact fault or the like of the terminal PT and the terminal PL (see FIG. 1A), can be appropriately detected. Incidentally, although the through silicon via TSV is also included in the monitoring line M, an increase of resistance of the monitoring line M does not affect the monitoring of the potential because no current flows into the monitoring line M.

Further, in the semiconductor device 1 according to the first embodiment, a power-supply voltage and various signals are supplied from the external tester via the test pads TP for a wafer test, and therefore it is possible to perform the test without causing any damage on the terminal PL and the through silicon via TSV of the semiconductor chip.

In the first embodiment, a method of monitoring the potentials of the internal power-supply lines V1 and V2 of each of the semiconductor chips C1 to C4 in a state of the semiconductor device 1, that is, in a state before the chips being stacked on the controller chip C0, by using the test pads TP of the semiconductor chip C1 is explained. However, even in a state after the semiconductor device 1 being stacked on the controller chip C0, that is, even in a state of the composite semiconductor device 10, the potentials of the internal power-supply lines V1 and V2 of each of the semiconductor chips C1 to C4 can be monitored using the monitoring method according to the present invention. Specifically, in the composite semiconductor device 10, by respectively connecting the terminals PL that are connected to the test pads TP of the semiconductor chip C1, that is, a power-supply monitoring terminal, a test address terminal, a test command terminal, a test-chip select terminal, test clock terminals, a test-clock enable terminal, and a test terminal, to the through silicon vias TSV5 (see FIG. 6C) provided on the controller chip C0, it becomes possible to access the semiconductor device 1 in a direct manner via the bump electrodes 13, that is, without using any control circuit of the controller chip C0. By using this configuration, it becomes possible to implement substantially the same monitoring method as that using the test pads TP described above even in the composite semiconductor device 10.

Figure 9:
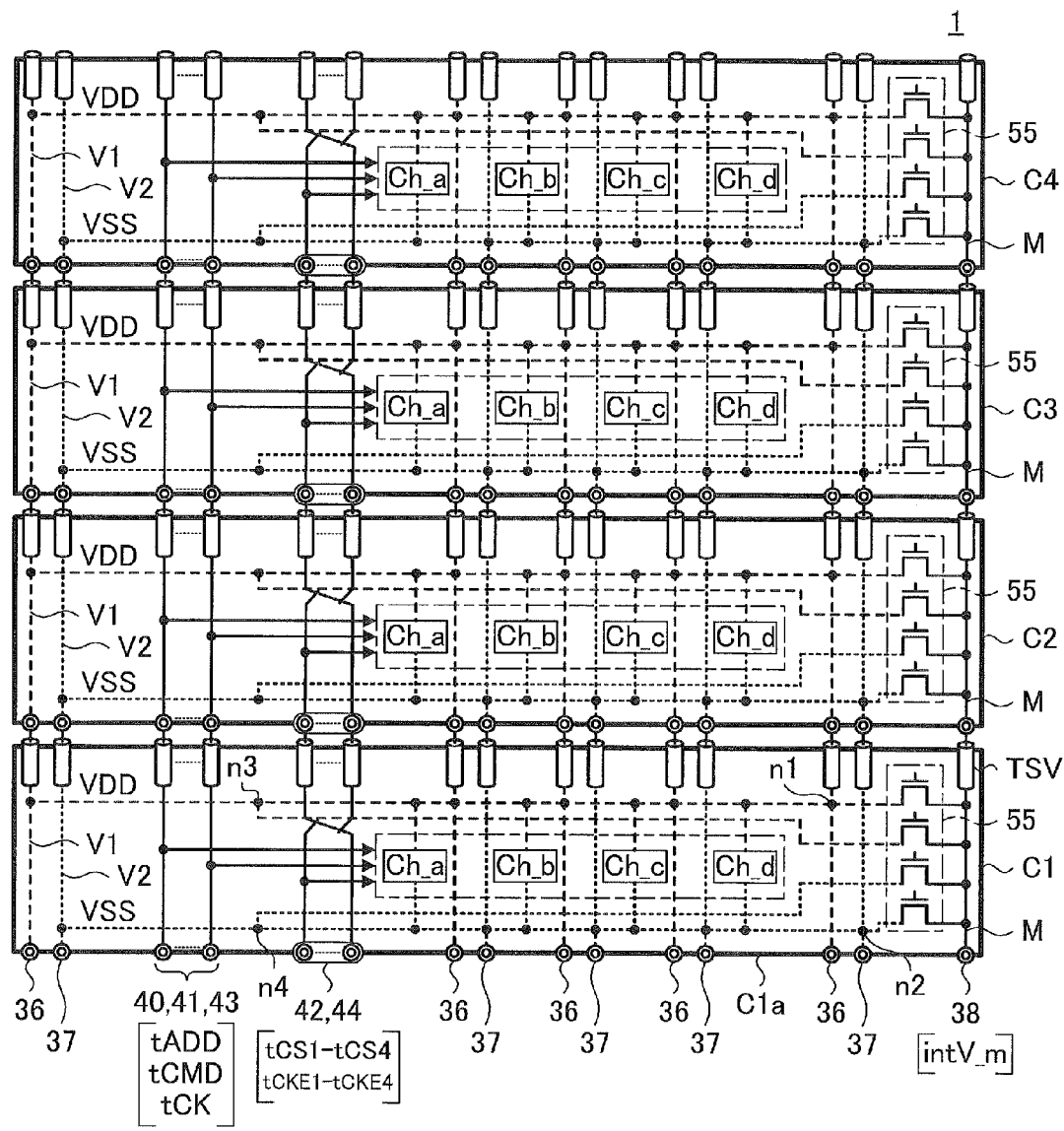
FIG. 9 is a schematic diagram showing a connection state of wiring lines between semiconductor chips and inside of the semiconductor chips in the semiconductor device 1 according to a second embodiment of the present invention.

Turning to FIG. 9, the semiconductor device 1 according to the second embodiment of the present invention is different from the semiconductor device 1 according to the first embodiment in that connection points of the monitoring line M and the internal power-supply lines V1 and V2 are provided at a total of 16 points, that is, two points for each semiconductor chip and each internal power-supply line (nodes n1 to n4 shown in FIG. 9). Furthermore, with an increase of the connection points of the monitoring line M and the internal power-supply lines V1 and V2, the number of transistors in the switch circuit 55 provided at each connection point is also increased to 16. Other features of the semiconductor device 1 according to the second embodiment are identical to those of the semiconductor device 1 according to the first embodiment.

According to the semiconductor device 1 of the second embodiment, because the connection points of the monitoring line M and the internal power-supply lines V1 and V2 are increased, even when potentials of the internal power-supply lines V1 and V2 differ depending on a position of the wiring line, it is possible to appropriately detect disconnection or an increase of resistance of the internal power-supply lines V1 and V2. The number of each of the additional connection points (nodes n3, n4 in FIG. 9) is not limited to one but can be plural. In that case, the number of transistors in the switch circuit 55 should increase with an increase of the connection points.

A modification of the above embodiments is explained next with reference to FIG. 10. In FIGS. 1, 2, 8, and 9, a configuration in which the through silicon via TSV and the terminal PT are formed on all the semiconductor chips C1 to C4 is shown. Meanwhile, a first modification has a configuration in which the through silicon via TSV and the terminal PT are formed on the semiconductor chips C1 to C3, but the through silicon via TSV and the terminal PT are not formed on the semiconductor chip C4 as shown in FIG. 10.

It is because the semiconductor chip C4 is a semiconductor chip on the uppermost part of the semiconductor device 1, it suffices that signals and the power supplied from the terminal PT of the semiconductor chip C3 are taken in the semiconductor chip C4 itself via the terminal PL thereof, and it is not necessary to supply the signals supplied from the terminal PT of the semiconductor chip C3 to other semiconductor chips.

Figure 10:
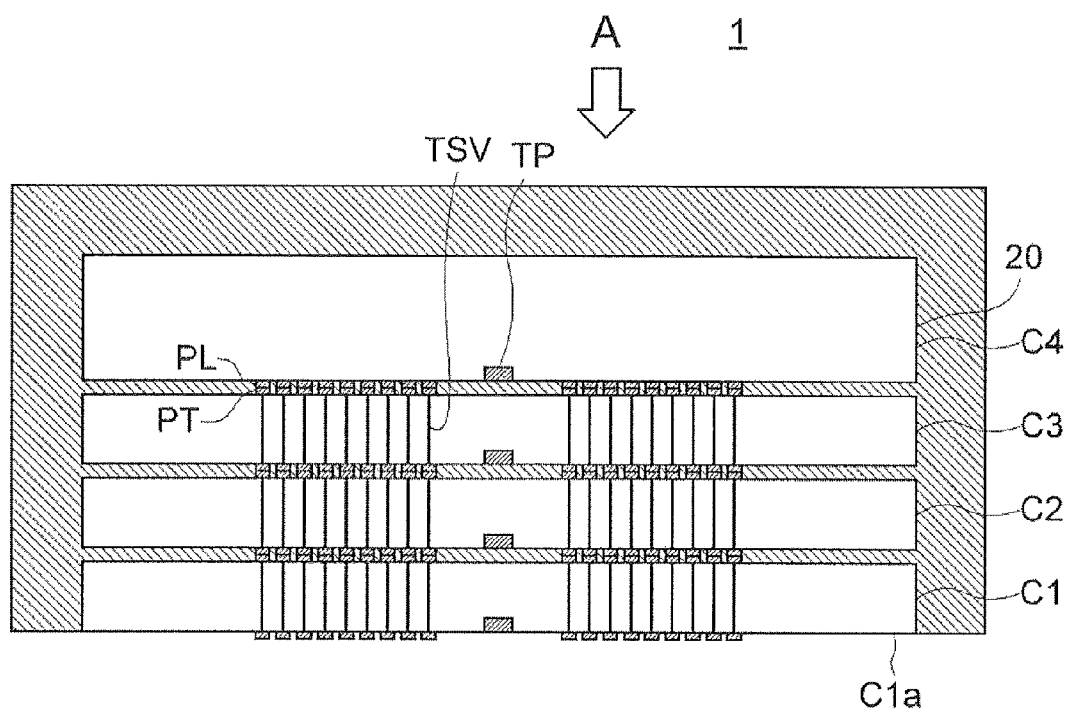
FIG. 10 is a schematic cross-sectional view of a semiconductor device according to a modification of the first and second embodiments of the present invention.

As described above, in case the through silicon via TSV and the terminal PT are not formed on the semiconductor chip C4, it is not necessary to have the semiconductor chip C4 made thin so as to facilitate the formation of the through silicon via TSV and the terminal PT, and thus the semiconductor chip C4 can be thicker than the semiconductor chips C1 to C3 as shown in FIG. 10. As a result, it is possible to suppress deformation of chips due to thermal stress at the time of manufacturing the semiconductor device 1, specifically, at the time of stacking the semiconductor chips C1 to C4.

In FIGS. 1, 2, 8, and 9, the semiconductor device 1 having four semiconductor chips C1 to C4 stacked therein has been explained as an example. However, the present invention can be also applied to other semiconductor devices such as those in which the number of stacked semiconductor chips is two or more. Even in such semiconductor chips not having four semiconductor chips stacked therein, the configuration described in the first modification can be applied. That is, as for such a semiconductor device, it is possible to apply a configuration in which the through silicon via TSV and the terminal PT are not formed on a semiconductor chip stacked on the uppermost part in the semiconductor device, and the semiconductor chip stacked on the uppermost part is made thicker than other semiconductor chips stacked in the semiconductor device.

It is apparent that the present invention is not limited to the above embodiments, but may be modified and changed without departing from the scope and spirit of the invention.

For example, in the above embodiments, a stacked semiconductor device using the through silicon via TSV has been explained as an example; however, the present invention can be also applied in the same manner to other semiconductor devices that do not use the through silicon via TSV.

Furthermore, in the above embodiments, semiconductor chips each including a plurality of channels each functioning as a single DRAM has been explained as an example; however, the present invention can be also applied to other semiconductor chips each including only one channel.

Further, in the above embodiments, detection of disconnection and an increase of resistance of internal power-supply lines to which a power-supply voltage is supplied has been explained as an example; however, the present invention can be widely applied to internal lines (internal power supply lines) to which any type of voltage is supplied, such as a reference voltage.

What is claimed is:

1. A device comprising:
    an internal circuit;
    a first terminal supplied with a first voltage;
    a first power-supply line coupled between the first terminal and the internal circuit;
    a potential monitoring terminal configured to supply a monitored potential to outside the device when the device is in a test mode in response to a received test mode signal;
    a first switch coupled between the first power-supply line and the potential monitoring terminal;
    a second terminal supplied with a second voltage different from the first voltage;
    a second power-supply line coupled between the second terminal and the internal circuit;
    a second switch coupled between the second power-supply line and the potential monitoring terminal;
    wherein:
    the first power-supply line includes a first node and a third node apart from the first node,
    the second power-supply line includes a second node and a fourth node apart from the, third node,
    the first switch is coupled between the first node of the first power-supply line and the potential monitoring terminal, and
    the second switch is coupled between the second node of the second power-supply line and the potential monitoring terminal,
    the device further comprises:
    a third switch coupled between the third node of the first power-supply line and the potential monitoring terminal; and
    a fourth switch coupled between the fourth node of the second power-supply line and the potential monitoring terminal.

2. The device as claimed in claim 1, wherein the internal circuit includes an access control circuit supplying a first control signal to a control electrode of the first switch and supplying a second control signal to a control electrode of the second switch.

3. The device as claimed in claim 1, further comprising:
    a first semiconductor substrate;
    a second semiconductor substrate stacked on one surface of the first semiconductor substrate; and
    first and second penetration electrodes penetrating the first semiconductor substrate, wherein
    the internal circuit, the first and second power-supply lines, and the first and second switches are formed on the second semiconductor substrate,
    the first and second terminals are arranged on the other surface of the first semiconductor substrate,
    the first power-supply line is coupled to the first terminal via the first penetration electrode, and
    the second power-supply line is coupled to the second terminal via the second penetration electrode.

4. The device as claimed in claim 1, further comprising first and second semiconductor substrates stacked on each other, each of the first and second semiconductor substrates including the internal circuit, the first and second terminals, the first and second power-supply lines, the potential monitoring terminal, and the first and second switches, wherein the first semiconductor substrate includes:
    a first penetration electrode coupled between the first terminal of the first semiconductor substrate and the first terminal of the second semiconductor substrate;
    a second penetration electrode coupled between the second terminal of the first semiconductor substrate and the second terminal of the second semiconductor substrate; and
    a third penetration electrode coupled between the potential monitoring terminal of the first semiconductor substrate and the potential monitoring terminal of the second semiconductor substrate.

5. A semiconductor device comprising:
    an internal circuit;
    a first terminal supplied with a first voltage;
    a first power-supply line coupled between the first terminal and the internal circuit;
    a potential monitoring terminal;
    a first switch coupled between the first power-supply line and the potential monitoring terminal;
    a first semiconductor substrate;
    a second semiconductor substrate stacked on one surface of the first semiconductor substrate; and
    a first penetration electrode penetrating the first semiconductor substrate;
    wherein the internal circuit, the first power-supply line, and the first switch are formed on the second semiconductor substrate, the first terminal is arranged on the other surface of the first substrate, and the first power-supply line is coupled to the first terminal via the first penetration electrode.

6. The semiconductor device as claimed in claim 5, further comprising a third penetration electrode penetrating the first semiconductor substrate, wherein the potential monitoring terminal is arranged on the other surface of the first substrate, and the first switch is coupled to the potential monitoring terminal via the third penetration electrode.

7. A semiconductor device comprising:
an internal circuit;
a first terminal supplied with a first voltage;
a first power-supply line coupled between the first terminal and the internal circuit;
a potential monitoring terminal;
a first switch coupled between the first power-supply line and the potential monitoring terminal;
first and second semiconductor substrates stacked on each other, each of the first and second semiconductor substrates including the internal circuit, the first terminal, the first power-supply line, the potential monitoring terminal, and the first switch;
wherein the first semiconductor substrate includes a first penetration electrode coupled between the first terminal of the first semiconductor substrate and the first terminal of the second semiconductor substrate and a second penetration electrode coupled between the potential monitoring terminal of the first semiconductor substrate and the potential monitoring terminal of the second semiconductor substrate.

* * * * *